United States Patent [19]
Ding

[11] Patent Number: 6,016,068
[45] Date of Patent: Jan. 18, 2000

[54] POWER ON RESET CIRCUIT CAPABLE OF GENERATING POWER ON RESET SIGNAL WITHOUT FAIL

[75] Inventor: Lei Ding, Hyogo, Japan

[73] Assignee: Mitsubishi Denki Kabushiki Kaisha, Tokyo, Japan

[21] Appl. No.: 09/035,922

[22] Filed: Mar. 6, 1998

[30] Foreign Application Priority Data

Sep. 9, 1997 [JP] Japan ................................ 9-243648

[51] Int. Cl.⁷ ................................................ H03L 7/00
[52] U.S. Cl. ............................ 327/142; 327/143; 327/198
[58] Field of Search .................................. 327/142, 143, 327/198, 541, 546

[56] References Cited

U.S. PATENT DOCUMENTS

| | | | |
|---|---|---|---|
| 4,196,362 | 4/1980 | Maehashi | 327/77 |
| 5,374,923 | 12/1994 | Sakamoto | 340/654 |
| 5,442,312 | 8/1995 | Walter | 327/198 |
| 5,546,045 | 8/1996 | Sauer | 327/561 |
| 5,570,050 | 10/1996 | Conary | 327/143 |
| 5,646,563 | 7/1997 | Kuo | 327/157 |

*Primary Examiner*—Kenneth B. Wells
*Assistant Examiner*—Hai L. Nguyen
*Attorney, Agent, or Firm*—McDermott, Will & Emery

[57] ABSTRACT

A power on reset circuit includes: interconnected first and second inverter circuits; a capacitor connected to an input node of the first inverter circuit; and a buffer circuit responsive to voltage at an output node for generating a power on reset signal. In the power on reset circuit, in order to increase source voltage of an N channel MOS transistor in the second inverter circuit to a voltage higher than ground voltage, a diode-connected transistor is inserted between the source of the transistor and a ground node. Thus, the power on reset circuit never fails to produce the power on reset signal even when power supply voltage is dropped.

7 Claims, 3 Drawing Sheets

POWER ON RESET CIRCUIT CAPABLE OF GENERATING POWER ON RESET SIGNAL WITHOUT FAIL

BACKGROUND OF THE INVENTION

1. Field of the Invention

The present invention relates to power on reset circuits, and more specifically, to a power on reset circuit generating a power on reset signal for a prescribed period of time after power supply is turned on.

2. Description of the Background Art

In most semiconductor integrated circuit devices including DRAMs (Dynamic Random Access Memories), SRAMs (Static Random Access Memories) and microprocessors, a power on reset circuit is employed. The power on reset circuit generates a power on reset signal for a prescribed period of time after power supply is turned on so as to initiate an internal circuit which has been in an unstable state before power supply is turned on. The power on reset signal is activated for a prescribed period of time until power supply voltage attains a prescribed level, after which it is inactivated. The above mentioned internal circuit is reset in response to the activated power on reset signal.

Recently, a semiconductor integrated circuit device which employs two different power supply voltages is also available. In addition, the semiconductor integrated circuit device may be tested by increasing or dropping power supply voltage. Here, higher and lower power supply voltages are respectively defined as high and low power supply voltages. Some DRAMs, for example, employ high power supply voltage of 5.0V in normal operation mode and low power supply voltage of 1.3V in standby operation mode.

When such a semiconductor integrated circuit device is employed in the conventional power on reset circuit, the internal circuit fails to be reset when power supply voltage is returned from low to high power supply voltage. More specifically, the conventional power on reset circuit fails to generate the power on reset signal unless power supply voltage increases again after dropping below 0.76V. In a DRAM where low power supply voltage of 1.3V is employed during standby operation mode, for example, the internal circuit is not reset unless the power on reset signal is generated after the end of standby operation mode.

SUMMARY OF THE INVENTION

An object of the present invention is to provide a power on reset circuit capable of surely generating a power on reset signal when power supply voltage is again increased after its temporary drop.

According to one aspect of the present invention, the power on reset circuit for generating a power on reset signal for a prescribed period of time after power supply is turned on includes a first CMOS inverter circuit, a second CMOS inverter circuit, a capacitor, a voltage boosting circuit and a buffer circuit. The second CMOS inverter circuit has input and output nodes respectively connected to output and input nodes of the first CMOS inverter circuit. The capacitor is connected between a power supply node and the input node of the first CMOS inverter circuit. The voltage boosting circuit increases source voltage of an N channel MOS transistor in the second CMOS inverter circuit by prescribed voltage from ground voltage. The buffer circuit generates the power on reset signal in response to voltage at the output node of the first CMOS inverter circuit.

Preferably, the voltage boosting circuit includes a transistor which is diode-connected between a source of the N channel MOS transistor and a ground node.

Preferably, the voltage boosting circuit also includes a plurality of transistors and a switching element. The plurality of transistors are connected in series between the source of the N channel MOS transistor and the ground node. The transistors are each diode-connected. The switching element is connected in parallel to at least one of the plurality of transistors.

Preferably, the voltage boosting circuit further includes a control circuit controlling on/off of the switching element in response to power supply voltage.

According to another aspect of the present invention, a power on reset circuit for generating a power on reset signal for a prescribed period of time after power supply is turned on includes first and second nodes, a capacitor, first to sixth transistors and a buffer circuit. The capacitor is connected between a power supply node and the first node. The first transistor has its gate connected to the first node, source connected to the power supply node and drain connected to the second node. The second transistor has its gate connected to the first node, drain connected to the second node and source connected to a ground node. The third transistor has its gate connected to the second node, source connected to the power supply node and drain connected to the first node. The fourth transistor has its gate connected to the second node. The fifth transistor has its gate receiving a prescribed voltage, drain connected to the first node and source connected to a drain of the fourth transistor. The sixth transistor has its gate and drain connected to a source of the fourth transistor, and source connected to the ground node. The buffer circuit generates the power on reset signal in response to a voltage at the second node.

In the power on reset circuit according to the present invention, source voltage of the N channel MOS transistor in the CMOS inverter circuit is increased by a prescribed voltage from ground voltage, so that the level at which the power on reset signal is activated increases. Thus, the power on reset signal can surely be activated even when power supply voltage is dropped from high to low power supply voltage. As a result, even when a semiconductor integrated circuit device with the power on reset circuit is brought into low power supply voltage mode, its internal circuit can be reset without fail.

In addition, the diode-connected transistors are provided between the source of the N channel MOS transistor and the ground node in order to increase the source voltage by prescribed voltage from ground voltage, so that the power on reset circuit can be implemented without large increase in layout area.

Moreover, a plurality of transistors which are connected in series and each diode-connected are inserted between the source of the N channel MOS transistor and the ground node in order to increase the source voltage by prescribed voltage from ground voltage, and a switching element is connected in parallel to at least one of these transistors. Therefore, the level at which the power on reset signal is activated can be adjusted.

Further, on/off of the switching element is controlled in response to the power supply voltage, so that the level at which the power on reset signal is activated in response to the employed low power supply voltage is automatically adjusted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
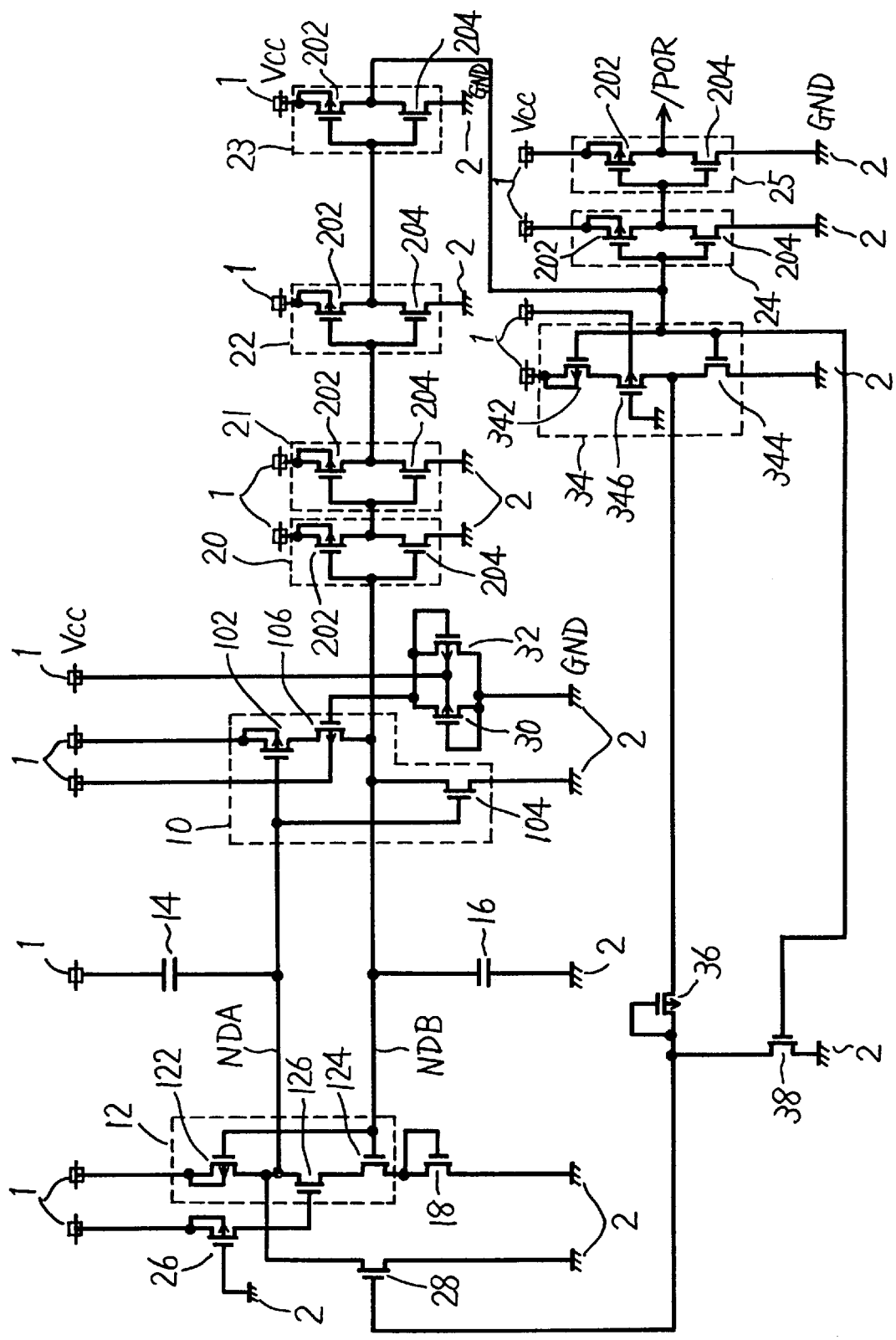
FIG. 1 is a circuit diagram showing an overall arrangement of a power on reset circuit in accordance with a first embodiment of the present invention.

Now, embodiments of the present invention will be described in detail with reference to the drawings. It is noted that the same or corresponding portions in the drawings have the same reference numerals and the description thereof will not be repeated.

First Embodiment

FIG. 1 is a circuit diagram showing an overall arrangement of a power on reset circuit in accordance with a first embodiment of the present invention. Referring to FIG. 1, the power on reset circuit includes CMOS inverter circuits 10 and 12, a capacitor 14 and an N channel MOS transistor 18.

CMOS inverter circuit 10 includes a P channel MOS transistor 102, an N channel MOS transistor 104 and a P channel MOS transistor 106. P channel MOS transistor 102 has its gate connected to a node NDA, source connected to a power supply node 1 and drain connected to a node NDB through P channel MOS transistor 106. N channel MOS transistor 104 has its gate connected to node NDA, drain connected to node NDB and source connected to a ground node 2. P channel MOS transistor 106 is connected between P channel MOS transistor 102 and node NDB.

CMOS inverter circuit 12 includes a P channel MOS transistor 122, and N channel MOS transistors 124 and 126. P channel MOS transistor 122 has its gate connected to node NDB, source connected to power supply node 1 and drain connected to node NDA. N channel MOS transistor 124 has its gate connected to node NDB, drain connected to node NDA through N channel MOS transistor 126 and source connected to the ground node through N channel MOS transistor 18. N channel MOS transistor 126 has its gate receiving prescribed voltage, drain connected to node NDA and source connected to the drain of N channel MOS transistor 124.

Capacitor 14 is connected between power supply node 1 and node NDA. N channel MOS transistor 18, which serves to increase source voltage of N channel MOS transistor 124 by threshold voltage Vth from ground voltage GND, is connected between the source of the N channel MOS transistor and ground node 2, and is diode-connected.

The power on reset circuit further includes a buffer circuit including six CMOS inverter circuits 20 to 25. The buffer circuit (CMOS inverter circuits 20 to 25) generates a power on reset signal /POR in response to the voltage at output node NDB of CMOS inverter circuit 10. Each of CMOS inverter circuits 20 to 25 has a P channel MOS transistor 202 and an N channel MOS transistor 204.

The power on reset circuit further includes a capacitor 16, a P channel MOS transistor 26, an N channel MOS transistor 28, P channel MOS transistors 30 and 32, a CMOS inverter circuit 34, a P channel MOS transistor 36 and an N channel MOS transistor 38.

Capacitor 16 is connected between node NDB and ground node 2. P channel MOS transistor 26 has its gate connected to ground node 2, source connected to power supply node 1, and drain connected to the gate of N channel MOS transistor 126. P channel MOS transistor 26 supplies prescribed voltage to the gate of N channel MOS transistor 126, as it functions as a resistance. N channel MOS transistor 28 is connected between node NDA and ground node 2. Each of P channel MOS transistors 30 and 32 is connected between the gate of P channel MOS transistor 106 and ground node 2. P channel MOS transistor 30 has its gate connected to its own drain and P channel MOS transistor 32 has its gate connected to its own source. Thus, P channel MOS transistors 30 and 32 supply prescribed voltage to the gate of P channel MOS transistor 106.

CMOS inverter circuit 34 includes a P channel MOS transistor 342, an N channel MOS transistor 344 and a P channel MOS transistor 346. P channel MOS transistor 36 is connected between the output node of CMOS inverter circuit 34 and the gate of N channel MOS transistor 28, and is diode-connected. N channel MOS transistor 38 has its gate connected to the output node of CMOS inverter circuit 23, and is connected between the gate of N channel MOS transistor 28 and ground node 2.

The power on reset circuit has a level dependent function for generating power on reset signal /POR for a prescribed period of time when power supply voltage VCC is gradually increased after power supply is turned on, and a time dependent function for generating power on reset signal /POR for a prescribed period of time when power supply voltage VCC is rapidly increased after power supply is turned on. Thus, the power on reset circuit never fails to generate the power on reset signal for a prescribed period of time no matter whether power supply voltage VCC is increased gradually or rapidly.

Here, in order to implement the time dependent function, capacitor 16, N channel MOS transistor 28, CMOS inverter circuit 34, P channel MOS transistor 36 and N channel MOS transistor 38 are provided. As the present invention is characterized by the circuits other than the above mentioned circuits for implementing the time dependent function, the operation of the circuits for implementing the level dependent function will mainly be described.

Figure 2:
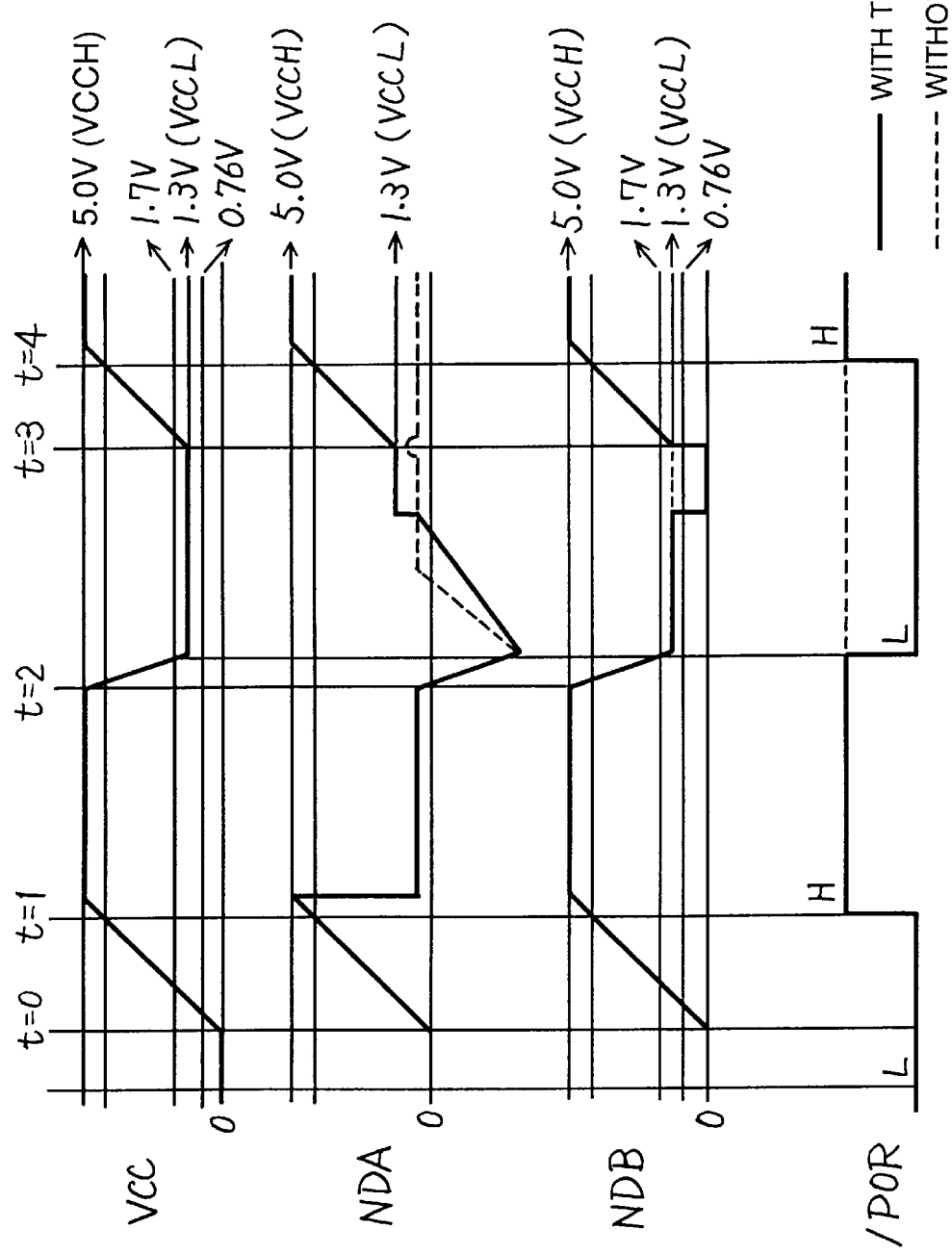
FIG. 2 is a diagram showing waveforms related to the operation of the power on reset circuit in accordance with the first embodiment shown in FIG. 1.

FIG. 2 is a diagram showing waveforms related to the operation of the power on reset circuit shown in FIG. 1. Referring to FIG. 2, when power supply is turned on at time t=0, power supply voltage VCC gradually increases toward high power supply voltage VCCH (for example of 5.0V). Thus, voltages at nodes NDA and NDB also increase following power supply voltage VCC. Until t=1 at which voltage at node NDB attains a prescribed level, activated power on reset signal /POR at L (low) level is generated from the buffer circuit (which includes inverter circuits 20 to 25).

When voltage at node NDB attains the prescribed level at time t=1, power on reset signal /POR is inactivated to H (high) level. As the voltage at node NDB attains high power supply voltage VCCH, N channel MOS transistor 124 is turned on. At the time, voltage at node NDA drops to a prescribed level as N channel MOS transistor 126, which has its gate receiving power supply voltage VCC through P channel MOS transistor 26, is always on. The level is determined by the threshold voltage of diode-connected N channel MOS transistor 18.

In a steady state (time between t=1 and t=2) after power supply voltage VCC has attained high power supply voltage VCCH, as voltage at node NDA has dropped to the prescribed level, P channel MOS transistor 102 is turned on and power supply voltage VCC is supplied to node NDB through P channel MOS transistors 102 and 106. As voltage at node NDB has attained the high power supply voltage, N channel MOS transistor 124 is turned on and electric charges at node NDA are discharged to ground node 2 through N channel MOS transistors 126, 124 and 18.

Thereafter, when power supply voltage VCC begins to drop from high power supply voltage VCCH toward low power supply voltage VCCL, voltage at node NDA drops to a prescribed negative level due to coupling effect of capacitor 14. Voltage at node NDB drops to low power supply voltage VCCL following power supply voltage VCC.

Then, if N channel MOS transistor 18 is not provided, it follows that N channel MOS transistor 124 is not turned on unless voltage at node NDB becomes lower than threshold voltage (for example of 0.76V) of N channel MOS transistor 124 as source voltage of N channel MOS transistor 124 is ground voltage. As a result, node NDB maintains H level and power on reset signal /POR is not activated to L level.

However, in the power on reset circuit with N channel MOS transistor 18 of the present invention, when voltage at node NDB becomes lower than prescribed voltage (here, 1.7V≈0.76V+1.0V), N channel MOS transistor 124 is turned off. This is because source voltage of N channel MOS transistor 124 is increased by the threshold voltage (for example of about 1.0V) of N channel MOS transistor 18 from ground voltage GND. Here, voltage at node NDB drops to low power supply voltage VCCL of 1.3V which is lower than 1.7V, and attains L level, so that power on reset signal /POR is activated to L level.

As described above, N channel MOS transistor 124 is turned off and node NDA is charged by P channel MOS transistor 122 as the voltage at node NDB drops to 1.3V which is lower than 1.7V. Thus, voltage at node NDA increases to such level that is lower than low power supply voltage VCCL by threshold voltage of P channel MOS transistor 122. When voltage at node NDA becomes higher than threshold voltage of N channel MOS transistor 104, N channel MOS transistor 104 is turned on and voltage at node NDB drops to ground voltage GND, thereby resetting node NDB. When voltage at node NDB attains to ground level, P channel MOS transistor 122 is turned fully on and power supply voltage VCC (here, low power supply voltage VCCL) is directly supplied to node NDA.

Thereafter, power supply voltage VCC begins to increase toward high power supply voltage VCCH from low power supply voltage VCCL at time t=3 until it attains the prescribed level at time t=4, when power on reset signal /POR is again inactivated to H level.

In the foregoing, power supply voltage VCC has been described in detail as relatively slowly increased. Now, power supply voltage VCC will briefly be described as rapidly increased.

In the power on reset circuit, an output from CMOS inverter circuit 23 is delayed by CMOS inverter circuit 34 and P channel MOS transistor 36 before transmission to the gate of N channel MOS transistor 28, so that power on reset signal /POR is not inactivated immediately after power supply is turned on, even when power supply voltage VCC is rapidly increased. Thus, N channel MOS transistor 28 is off for a prescribed period of time after power supply is turned on even when power supply voltage VCC is rapidly increased, so that node NDA is not immediately discharged. Therefore, even when power supply voltage VCC is rapidly increased, inactivated power on reset signal /POR at L level is generated for a prescribed period of time after power supply is turned on.

As in the foregoing, according to the first embodiment, diode-connected N channel MOS transistor 18 is provided between N channel MOS transistor 124 and ground node 2, and source voltage of N channel MOS transistor 124 is increased by threshold voltage of N channel MOS transistor 18 from ground voltage GND. Thus, power on reset signal /POR can be activated without fail even when power supply voltage VCC drops from high power supply voltage VCCH to low power supply voltage VCCL. As a result, if the power on reset circuit is employed in a semiconductor integrated circuit device such as a DRAM, even when semiconductor integrated circuit device is brought into low power supply voltage mode, its internal circuit can be reset without fail.

Second Embodiment

In the above described first embodiment, the voltage level at which power on reset signal /POR is activated (which is 1.7V in the first embodiment) is fixed since a single N channel MOS transistor 18 is provided. Alternatively, the level can be made adjustable in accordance with the specification of the semiconductor integrated circuit device in which the power on reset circuit is employed.

Figure 3:
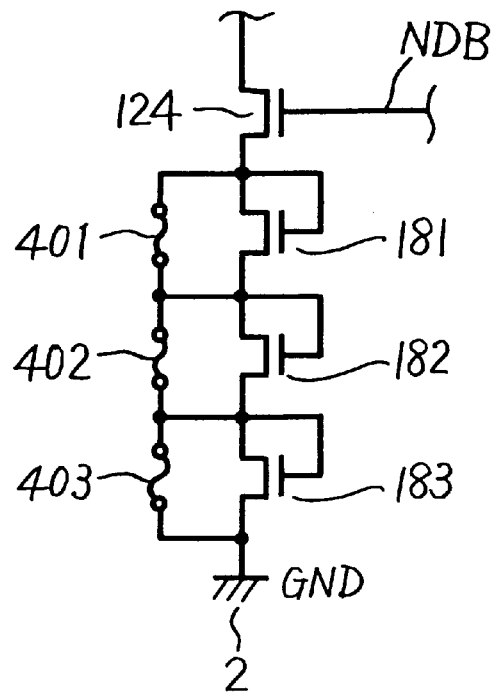
FIG. 3 is a circuit diagram showing an arrangement of the main portion of the power on reset circuit in accordance with a second embodiment of the present invention.

FIG. 3 is a circuit diagram showing an arrangement of the main portion of the power on reset circuit in accordance with a second embodiment which is intended for making the above mentioned level adjustable. Referring to FIG. 3, in the second embodiment, three N channel MOS transistors 181 to 183, instead of N channel MOS transistor 18 in the above described first embodiment, are connected in series between the source of N channel MOS transistor 124 and ground node 2. N channel MOS transistors 181 to 183 are each diode-connected. In addition, fuses 401 to 403 are respectively connected in parallel to N channel MOS transistors 181 to 183 as switching elements.

If none of fuses 401 to 403 is disconnected, source voltage of N channel MOS transistor 124 attains ground voltage GND. If one of fuses 401 to 403 is disconnected, source voltage of N channel MOS transistor 124 increases from ground voltage GND by the threshold voltage of that N channel MOS transistor which corresponds to the disconnected fuse. If two of fuses 401 to 403 are disconnected, source voltage of N channel MOS transistor 124 increases from ground voltage GND by the threshold voltages of the two N channel MOS transistors. If all of fuses 401 to 403 are disconnected, source voltage of N channel MOS transistor 124 increases from ground voltage GND by the threshold voltages of the three N channel MOS transistor 181 to 183.

Thus, by suitably disconnecting fuses 401 to 403 in accordance with the specification of the semiconductor integrated circuit device in which the power on reset circuit is employed, the level at which power on reset signal /POR is generated can be adjusted.

While three N channel MOS transistors 181 to 183 are provided here, the number of N channel MOS transistors is not particularly limited thereto. In addition, fuses 401 to 403 need not be connected in parallel to all of N channel MOS transistors 181 to 183, and the fuses may be connected in parallel to at least one of N channel MOS transistors.

Third Embodiment

In the above described second embodiment, the voltage level at which power on reset signal /POR is generated in response to power supply voltage is made manually adjustable. Alternatively, the voltage level can be made automatically adjustable in response to power supply voltage VCC.

Figure 4:
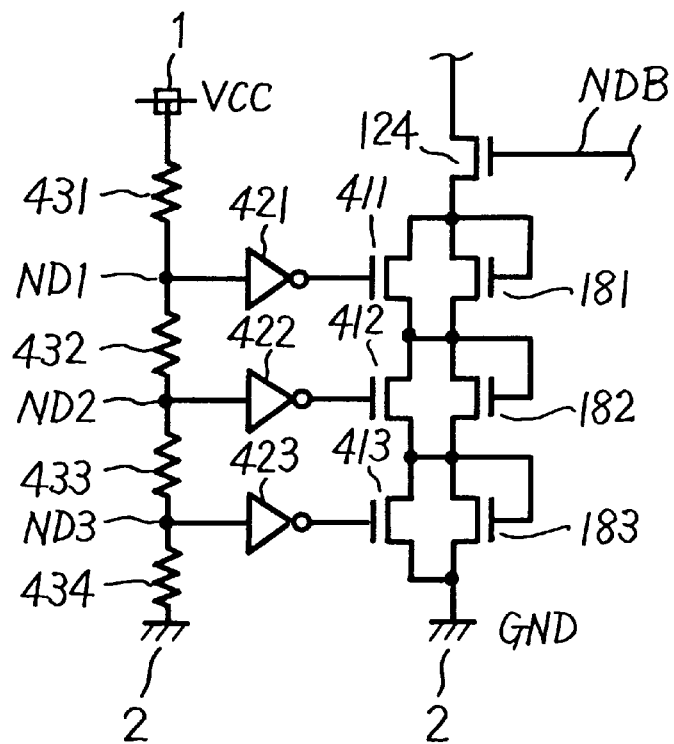
FIG. 4 is a circuit diagram showing an arrangement of the main portion of the power on reset circuit in accordance with a third embodiment of the present invention.

FIG. 4 is a circuit diagram showing an arrangement of the main portion of the power on reset circuit in accordance with a third embodiment which is intended for making the voltage level at which power on reset signal /POR is activated automatically adjustable in response to power supply voltage VCC. Referring to FIG. 4, in the third embodiment, N channel MOS transistors 411 to 413, instead of fuses 401 to 403 in the above described second embodiment, are connected as switching elements. In addition, resistances 431 to 434 are connected in series between power supply node 1 and ground node 2, and inverter circuits 421 to 423 are respectively connected between connecting nodes ND1 to ND3 of resistances 431 to 434 and gates of N channel MOS transistors 411 to 413.

When the employed low power supply voltage VCCL is relatively low, a larger number of N channel MOS transistors 411 to 413 are turned on, thereby decreasing the voltage level at which power on reset signal /POR is activated. On the other hand, when the employed low power supply voltage VCCL is relatively high, a smaller number of N channel MOS transistors 411 to 413 are turned on, whereby increasing the voltage level at which power on reset signal /POR is activated.

As in the foregoing, according to the third embodiment, as on/off of the N channel MOS transistor is controlled in response to power supply voltage VCC, the voltage level at which power on reset signal /POR is activated can be automatically adjusted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A power on reset circuit generating a power on reset signal for a prescribed time period after power supply is turned on, comprising:

a first CMOS inverter circuit;

a second CMOS inverter circuit having an input node connected to an output node of said first CMOS inverter circuit and an output node connected to an input node of said first CMOS inverter circuit;

a capacitor connected between a power supply node and the input node of said first CMOS inverter circuit;

voltage boosting means for boosting a source voltage of an N channel MOS transistor in said second CMOS inverter circuit by a prescribed voltage from ground voltage; and a buffer circuit responsive to a voltage of the output node of said first CMOS inverter circuit for generating said power on reset signal.

2. The power on reset circuit according to claim 1, wherein said voltage boosting means includes a transistor diode-connected between a source of said N channel MOS transistor and a ground node.

3. The power on reset circuit according to claim 1, wherein said voltage boosting means includes a plurality of transistors connected in series between a source of said N channel MOS transistor and a ground node and each diode-connected, and a switching element connected in parallel to at least one of said plurality of transistors.

4. The power on reset circuit according to claim 3, wherein said voltage boosting means includes control means for controlling said switching element to be turned on/off in response to a power supply voltage.

5. A power on reset circuit generating a power on reset signal for a prescribed time period after power supply is turned on, comprising:

a first node;

a second node;

a capacitor connected between a power supply node and said first node;

a first transistor having its gate connected to said first node, source connected to said power supply node and drain connected to said second node;

a second transistor having its gate connected to said first node, drain connected to said second node and source connected to a ground node;

a third transistor having its gate connected to said second node, source connected to said power supply node and drain connected to said first node;

a fourth transistor having its gate connected to said second node;

a fifth transistor having its gate receiving a prescribed voltage, drain connected to said first node and source connected to a drain of said fourth transistor;

a sixth transistor having its gate connected to a source of said fourth transistor, drain connected to a source of said fourth transistor and source connected to said ground node; and a buffer circuit responsive to a voltage of said second node for generating said power on reset signal.

6. The power on reset circuit according to claim 1, comprising:

a third CMOS inverter circuit coupled to the buffer circuit and the second CMOS inverter circuit.

7. The power on reset circuit according to claim 5, comprising:

a CMOS inverter circuit coupled to the buffer circuit and the third transistor.

\* \* \* \* \*